US005581127A

United States Patent [19]

Shinohara

[11] Patent Number: 5,581,127

[45] Date of Patent: Dec. 3, 1996

[54] IC MEMORY CARD, HOST DEVICE AND CONNECTING SYSTEM OF IC MEMORY CARD AND HOST DEVICE

[75] Inventor: Takayuki Shinohara, Itami, Japan

[73] Assignee: Mitsubishi Denki Kabushiki Kaisha, Tokyo, Japan

[21] Appl. No.: 266,678

[22] Filed: Jun. 28, 1994

[30] Foreign Application Priority Data

| | | | |
|---|---|---|---|
| Jun. 30, 1993 | [JP] | Japan | 5-160935 |
| Mar. 16, 1994 | [JP] | Japan | 6-046020 |

[51] Int. Cl.[6] .............................. H01L 23/02; H01L 23/48

[52] U.S. Cl. .............................. 257/679; 257/693; 257/730; 235/380; 235/492; 361/737

[58] Field of Search .............................. 257/679, 922, 257/693, 730; 235/380, 492; 361/737

[56] References Cited

U.S. PATENT DOCUMENTS

| | | | |
|---|---|---|---|
| 3,637,994 | 1/1972 | Ellingboe | 257/679 |
| 4,532,419 | 7/1985 | Takeda | 235/492 |
| 4,565,922 | 1/1986 | Anderson | 235/492 |
| 5,189,638 | 2/1993 | Kimura | 257/679 |

FOREIGN PATENT DOCUMENTS

| | | | |
|---|---|---|---|
| 2333449 | 1/1974 | Germany | 257/679 |
| 3503575 | 8/1986 | Germany | 257/679 |

*Primary Examiner*—Sara W. Crane
*Assistant Examiner*—David Ostrowski
*Attorney, Agent, or Firm*—Leydig, Voit & Mayer

[57] ABSTRACT

An IC memory card for connecting to a host device connector has a width and a length of substantially standard dimensions, a pair of longer sides, and a connector portion disposed at one of the longer sides and having a connector for electrically connecting the IC memory card to the host device connector. The IC memory card may have a wrong insertion preventing structure for preventing insertion of the IC memory card into the host device connector in an orientation other than the connector portion of the IC memory card. A host device connector for receiving the connector portion of the IC memory card may have a wrong insertion preventing structure for preventing further insertion of the IC memory card by cooperating with the card when the IC memory card is inserted in an incorrect orientation. A connecting system includes the IC memory card and the host device connector including the described features.

9 Claims, 9 Drawing Sheets

IC MEMORY CARD, HOST DEVICE AND CONNECTING SYSTEM OF IC MEMORY CARD AND HOST DEVICE

BACKGROUND OF THE INVENTION

This invention relates to an IC memory card having semiconductor data storage elements and also to a mating connector provided to a host device (hereinafter referred to as host device connector). More particularly, this invention relates to a connecting system of the IC memory card and the host device connector.

Generally, an IC memory card has semiconductor data storage elements therein in the form of a card, and is widely used as an external storage for a host device such as a personal computer and POS terminal.

FIG. 15 is a perspective view showing a conventional IC memory card. As shown in FIG. 15, the IC memory card 8 comprises a frame 8*a* made for example of a resin, and two metal panels 8*b* having substantially rectangular shape and attached to the frame 8*a* from upper and lower directions. The metal panels 8*b* are attached to the frame 8*a* at the periphery portions of inner surfaces thereof. Elements such as semiconductor data storage elements (not shown) are mounted within the IC memory card. As shown in FIG. 15, a connector 1 is provided on one side wall of a shorter side of the IC memory card 8, and a double line of connector sockets 2 are arranged in a longitudinal direction with tens per one line. Each of the socket contacts 2 is formed in the shape of hole perpendicular to the end surface 1*a* of the connector 1, and terminals (not shown) electrically connected to semiconductor data storage elements packaged in the IC memory card 8 are formed within the socket contacts 2. As shown in FIG. 15, upside-down preventing grooves 3 which are upside-down preventing-means for preventing the IC memory card 8 from being inserted upside down into a host device connector are provided at both ends of the connector 1 in the form of grooves extending along the longer side of the IC memory card 8. The upside-down preventing grooves 3 have different shapes for preventing the upside-down insertion of the IC memory card.

FIG. 16 is a front view of a host device connector for receiving the IC memory card 8 shown in FIG. 15. FIG. 17 is a sectional view of the host device connector taken along the lines 17—17 in FIG. 16. As shown in FIGS. 16 and 17, the host device connector comprises a connector face 4 having a substantially rectangular shape and a frame-like connector guide 7 provided along the overall outer periphery of the connector face 4. Contact pins 5, which are terminals electrically connected to the inner system of the host device, project from the connector face 4 in the same arrangement as that of the socket contacts 2 so as to correspond to the socket contacts 2 provided in the connector 1 of the IC memory card 8. In the host device connector, upside-down preventing keys 6 are provided along the inner wall of the connector guide 7 perpendicularly to the connector face 4 so as to correspond to the upside-down preventing grooves 3, which is upside-down preventing means of the IC memory card 8. For attachment, the connector 1 of the IC memory card 8 is inserted in the host device connector. However, only when the IC memory card 8 is inserted in a correct orientation are the upside-down preventing keys 6 engaged with the upside-down preventing grooves 3 of the IC memory card 8 to complete attachment. In the IC memory card 8 and the host device connector constructed as described above, the connector 1 provided on the shorter side of the IC memory card 8 is inserted into the host device connector through an IC memory card insertion hole, the socket contacts 2 arranged in the connector 1 of the IC memory card 8 are fitted to the contact pins 5 provided on the host device connector to make contact electrically, whereby the electrical connection between the IC memory card and the host device is obtained. According to the guideline published by Japan Electronic Industry Development Association, the contact pitch and number of terminals of the socket contacts 2 are, for a contact pitch of 1.27 mm, 68 terminals (16 bit data bus) or 1.0 mm for 88 terminals (36 bit data bus) in an IC memory card of standard dimensions (width L 54.0 mm×length D 85.6 mm×thickness T 3.3 mm). As described above, the upside-down preventing grooves 3 and the upside-down preventing keys 6 are provided on the IC memory card and the host device respectively so that the upside-down preventing grooves 3 are engaged with the upside-down preventing keys 6 only when the IC memory card is inserted into the host device in the correct orientation. Accordingly, electrically wrong operation and breakage of the IC memory card 8 due to the upside-down insertion thereof can be prevented and mechanical breakage of contact pins 5 of the host device due to the insertion of the IC memory card 8 in a wrong orientation, i.e. from other side of the IC memory card where no connector is provided can also be prevented.

Recently, with the development of small-sized portable equipment, a half-sized IC memory card (54.0 mm×43.0 mm) has been developed. And, an IC memory card having almost square shape (54.0 mm×50.0 mm) larger than the half sized one has also been produced.

The connector 1 is provided on the shorter side of the IC memory card 8 as described above. In order to produce an IC memory card which needs more than 88 terminals, such as an IC memory card having a 64 bit data bus, in an IC memory card having standard dimensions, a connector having socket contacts 2 with a contact pitch narrower than 1 mm should be used. In this case, the dimensional errors occuring in the course of manufacturing accumulate even if they are very small errors, thereby greatly influencing the quality of the IC memory card. Therefore, it is necessary to produce such an IC memory card with very high accuracy. The production is very difficult in view of techniques and cost.

And, when the inner diameter of the socket contacts 2 is reduced and the contact pins 5 are made thinner to increase the number of terminals of the connector, the strength of the contact pins 5 is weakened, so that the contact pins 5 may happen to be undesirably bent and mechanically broken. Although the contact pins 5 are mounted on the connector face 4 made of resin by pressure insertion during manufacturing process, the thinner contact pins 5 can not be subjected to pressure insertion.

Further, when a half-sized IC memory card or an IC memory card having an almost square shape larger than the half sized one, which are described above, is inserted into the conventional host device connector of standard dimensions as shown in FIG. 16 in a wrong orientation rotated 90° from the correct direction, the card is undesirably inserted deeper into the host device connector without being obstructed by the upside-down preventing keys 6 provided on both ends of the host device connector because the width thereof is considerably smaller than that of the host device connector. By this, the contact pins 5 provided in the host device connector may be sometimes damaged, resulting in poor electrical reliability.

SUMMARY OF THE INVENTION

Accordingly, in order to overcome the above-discussed problems of the conventional IC memory card, an object of the present invention is to provide an IC memory card and a host device connector suitable therefor and capable of a remarkably increased a number of connector terminals while having a good electrical reliability with a contact size and contact pitch same as those of the conventional IC memory card. Another object of the present invention is to provide an IC memory card and a host device, connector suitable therefor and capable of a remarkably increased number of pins while keeping sufficient strength and preventing wrong insertion of the IC memory card.

In order to achieve the above objects, according to an aspect of the present invention, there is provided an IC memory card which has a pair of opposite longer sides, wherein one of the longer sides is occupied by a connector portion having a connector to be electrically connected to a host device connector, and wherein the width and length of the IC memory card are of substantially standard dimensions.

According to another aspect of the present invention, there is provided a host device connector comprising a wrong insertion preventing mechanism for preventing further insertion of said IC memory card by cooperating with the IC card when the IC card is erroneously inserted.

According to further aspect of the present invention, there is provided a connecting system comprising a host device connector for receiving the connector portion of the IC memory card to be electrically connected to the connector of the connector portion.

DESCRIPTION OF THE PREFERRED EMBODIMENTS

First Embodiment

Figure 1:
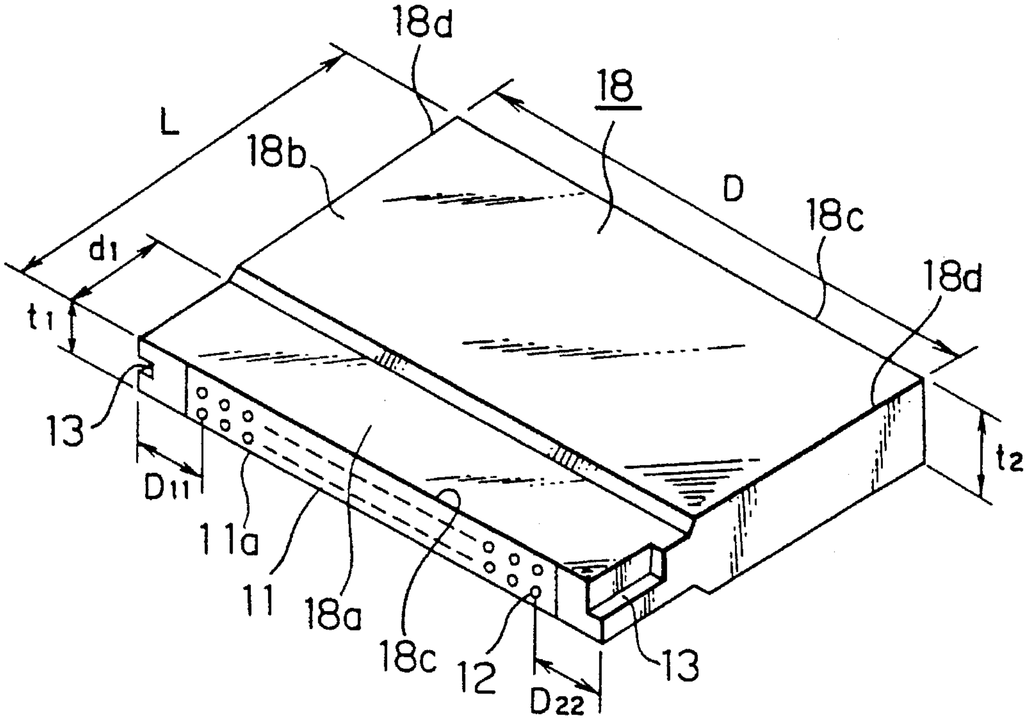
FIG. 1 is a perspective view showing a first embodiment of an IC memory card according to the present invention.
Figure 15:
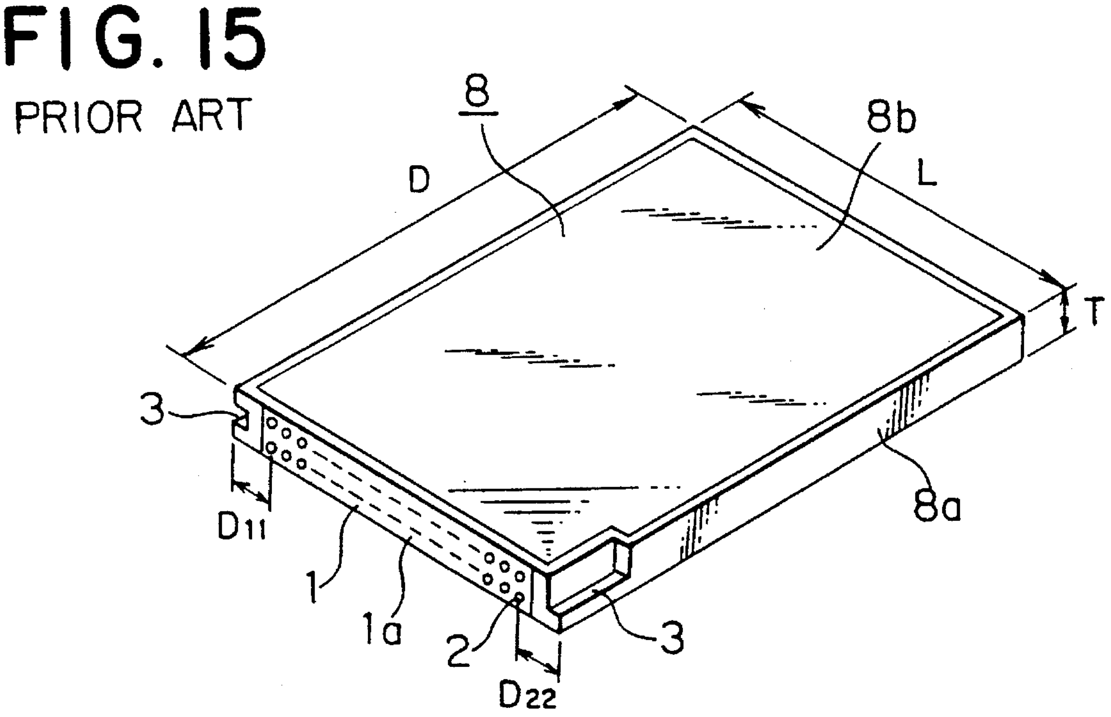
FIG. 15 PRIOR ART
FIG. 15 is a perspective view showing a conventional IC memory card.

FIG. 1 is a perspective view showing a first embodiment of an IC memory card according to the present invention. As shown in FIG. 1, the IC memory card 18 is of substantially rectangular shape having a pair of opposite longer sides **18*c* and a pair of opposite shorter sides 18*d*. The IC memory card 18 comprises a connector portion 18*a* occupying one of the longer sides 18*c* and having a connector 11, and a main body portion 18*b* excluding the connector portion 18*a*. The width (shorter side) L and the length (longer side) D of the whole IC memory card 18 including the connector portion 18*a* and the main body portion 18*b* are of substantially standard dimensions (54.0 mm×85.6 mm). A double line of socket contacts 12 is arranged in a longitudinal direction with the contact pitch of 1 mm in the same manner as in the prior art shown in FIG. 15 on an end face 11*a* of the connector 11 which is to be contacted with a connector face of a host device connector. In this embodiment, a thickness t1 of the connector portion 18*a* having a connector 11 is thinner than the thickness t2 of the main body portion 18*b*. The IC memory card 18 may comprise a package case formed, for example, of a metal plate and a resin frame and having a circuit board mounted therein, and it may be molded integrally with the packaged elements by resin or the like. Further, the IC memory card may be formed in other known suitable construction. At both ends of the longitudinal direction of the connector portion 18*a*, upside-down preventing grooves 13 which are upside-down preventing means for preventing upside-down insertion of the IC memory card into the host device connector are provided so as to have different shapes from each other. Since the conventional IC memory card as shown in FIG. 15 is always inserted at the shorter side thereof into the host device connector, there is a great possibility that the IC memory card according to the present invention will also be inserted at the shorter side thereof, i.e., in a wrong orientation rotated 90° from correct direction. Accordingly, in this embodiment, the thickness t1 of the connector portion 18*a*** to be inserted into the host device connector is thinner than the thickness t2 of the main body portion as a wrong insertion preventing means for preventing a wrong insertion of the IC memory card such as insertion in a wrong orientation rotated 90° from correct direction by cooperating with the host device connector.

Figure 2:
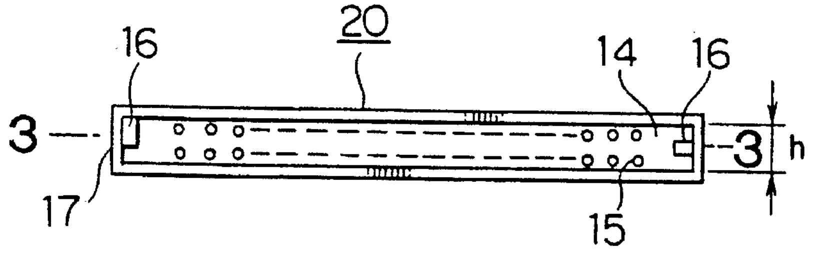
FIG. 2 is a front view showing a first embodiment of a host device connector.
Figure 3:
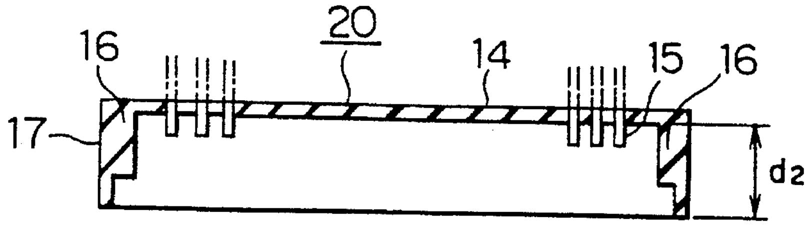
FIG. 3 is a sectional view of the host device connector taken along the line 3—3 in FIG. 2.
Figure 4:
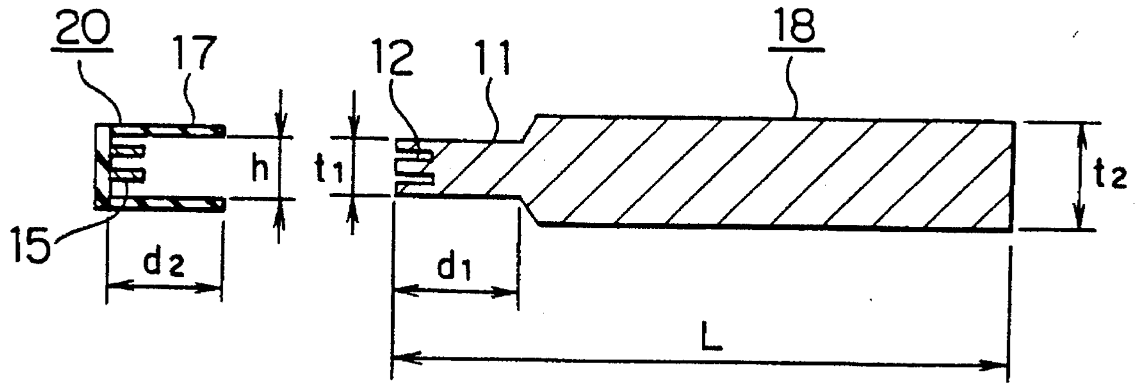
FIG. 4 is a side view showing a first embodiment of the IC memory card and the host device connector.
Figure 16:
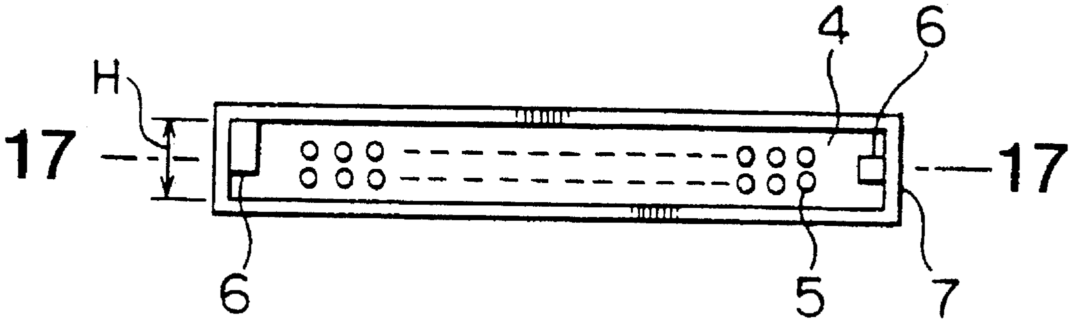
FIG. 16 PRIOR ART
FIG. 16 is a front view showing a conventional host device connector.
Figure 17:
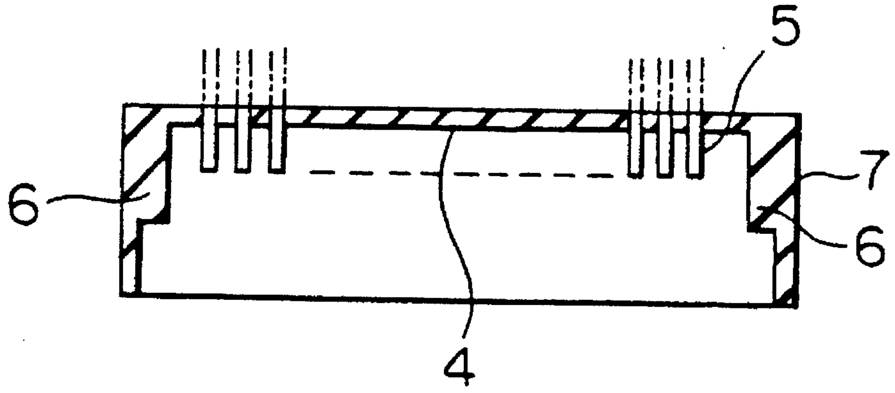
FIG. 17 PRIOR ART
FIG. 17 is a sectional view of the conventional host device connector taken along the line 17—17 in FIG. 16.

FIG. 2 shows a front view of a host device connector 20 for receiving the IC memory card shown in FIG. 1, and FIG. 3 is a sectional view of the host connector taken along the lines 3—3 in FIG. 2. As shown in FIGS. 2 and 3, the host device connector 20 according to the present invention comprises a plate-like connector face 14 having a substantially rectangular shape formed of resin or the like, and a frame-like connector guide 17 provided along the overall outer periphery of the connector face 14 and formed of resin or the like, similar to the conventional host device connector as shown in FIGS. 16 and 17. Contact pins 15, which are terminals electrically connected to the inner system of the host device, project from the connector face 14 in the same arrangement as the socket contacts 12 so as to be electrically connected to the socket contacts 12 provided in the connector 11 of the IC memory card 18 when attachment. In the host device connector 20, complementary upside-down preventing keys 16 are provided along the inner wall of the connector guide 17 perpendicular to the connector face 14 so as to correspond to the upside-down preventing grooves 13 of the IC memory card 18. The inner height h of the connector guide 17 of the host device connector 20 is $t1<h<t2$ (where t1 and t2 are thickness of the IC memory card 18), and the depth d2 of the host device connector 20 is $d2 \leqq d1$ ($<L$) (where d1 is a depth of the connector portion 18*a* of the IC memory card), as shown in FIG. 4 which is a schematic sectional view of the IC memory card 18 and the host device connector 20. A connecting system of the present invention comprises the IC memory card 18 and the host device connector 20 described above.

In the IC memory card 18 according to the present invention constructed as described above, the number of terminals can be remarkably increased as compared with the conventional case where the connector is provided on the shorter side of the IC memory card because the connector 11 is provided on the long side of the IC memory card 18. For example, since the connector 11 is provided on the shorter side (54 mm) of the conventional IC memory card 18 as shown in FIG. 15, the number of terminals of the socket contacts 12 is limited to 88 terminals in a double row even with a contact pitch of 1 mm. In case of the IC memory card 18 according to the present invention, 150 terminals of the socket contacts 12 can be provided in a double row with the contact pitch of 1 mm when the connector 11 is provided on the longer side (85.6 mm), as seen from the following calculations (1) and (2).

(1) In case of the conventional IC memory card (FIG. 15), 88 terminals of the socket contacts 2 are provided on the shorter side (54 mm) of the IC memory card with a contact pitch of 1 mm. Thus, a total length D1=D11+D12 of blank portions where no socket contacts are provided in the connector 1 is obtained by the following formula 1:

$$D1=54\ mm-\{(88\ \text{terminals}/2-1)\times 1\ mm\}=11\ mm \qquad \text{(formula 1)}$$

(2) When the socket contacts 12 are provided on the longer side (85.6 mm) of the IC memory card of the first embodiment (FIG. 1) with a contact pitch of 1 mm, the number of terminals N of the socket contacts 12 is obtained by the following formula 2, assuming that the minimum of D1 is 11 mm from the above calculation (1):

$$85.6\ mm-\{(N\ \text{terminals}/2-1)\times 1\ mm\}\geqq 11\ mm\ \ N\leqq 150\ \text{terminals} \qquad \text{(formula 2)}$$

In the IC memory card according to the present invention, the number of terminals can be increased by about 1.7 times compared to the conventional 88 terminals.

In the connecting system between the IC memory card and the host device connector according to this embodiment, the thickness t1 of the connector portion 18*a* of the IC memory card 18 is thinner than the thickness t2 of the body portion 18*b*, and the height h of the connector guide 17 of the host device connector 20 is set to satisfy the condition of $t1<h<t2$ as a wrong insertion preventing means. Accordingly, only the connector portion 18*a* can be inserted into the connector guide 17, and a further insertion may be prevented by touching of the connector guide 17 to the IC memory card. Insertion of the IC memory card in a wrong orientation rotated 90° from the correct direction and wrong insertion of the IC memory card from the other longer side thereof on which no connector 11 is provided may be prevented by cooperation of the connector guide 17 and the IC memory card 18. Thus, wrong insertion can be prevented and mechanical damage of the contact pins 15 in the host device connector 20 due to the wrong insertion of the IC memory card 18 can be prevented. For example, when the thickness t2 of the main body portion 18*b* of the IC memory card 18 is 3.3 mm, same as the thickness T of the conventional IC memory card shown in FIG. 15, the thickness t1 of the connector portion 18*a* may be set to 3.0 mm and the height h of the connector guide 17 may be set to satisfy the condition of $3.0\ mm<h<3.3\ mm$. When the height h of the connector guide 17 is set to $h<3.3$ mm, the cards which are not applicable to the host device connector 20 according to the present invention, such as the conventional IC memory card shown in FIG. 15, a half-sized card or a card having a substantially square shape may not be erroneously inserted.

Further, the thickness t1 of the connector portion 18*a* and the thickness t2 of the main body portion 18*b* of the IC memory card 18 may be set to satisfy the condition of $H<t1<t2$ or $H<t2$ where H ($>3.3$ mm) is the height of the conventional host device connector having a standard size shown in FIG. 16. In this case, wrong insertion of the IC memory card 18 according to the present invention into the conventional host device connector having an inner height H as shown in FIG. 16 can be prevented. The width of the conventional host device connector is shorter than the longer side of the IC memory card 18 according to the present invention. Accordingly, the IC memory card of the present invention may not be erroneously inserted from the longer side thereof. Then, when only the insertion from the shorter side, i.e., in a wrong orientation rotated 90° from correct direction is considered, overall the ,main body portion 18*b* (or overall the connector portion 18*a*) need not to be made thicker than H, and areas having a thickness of t satisfying the condition of $H<t$ may be provided on both shorter sides of the IC memory card 18.

The IC memory card 18 in this embodiment according to the present invention is provided with two upside-down preventing grooves 13 which have different shapes from each other, and the host device connector 20 is provided with two complementary upside-down preventing keys 16 so as to be engaged with two upside-down preventing grooves 13. Accordingly, turnover insertion of the IC memory card 18 into the host device connector can be prevented.

Second Embodiment

Figure 5:
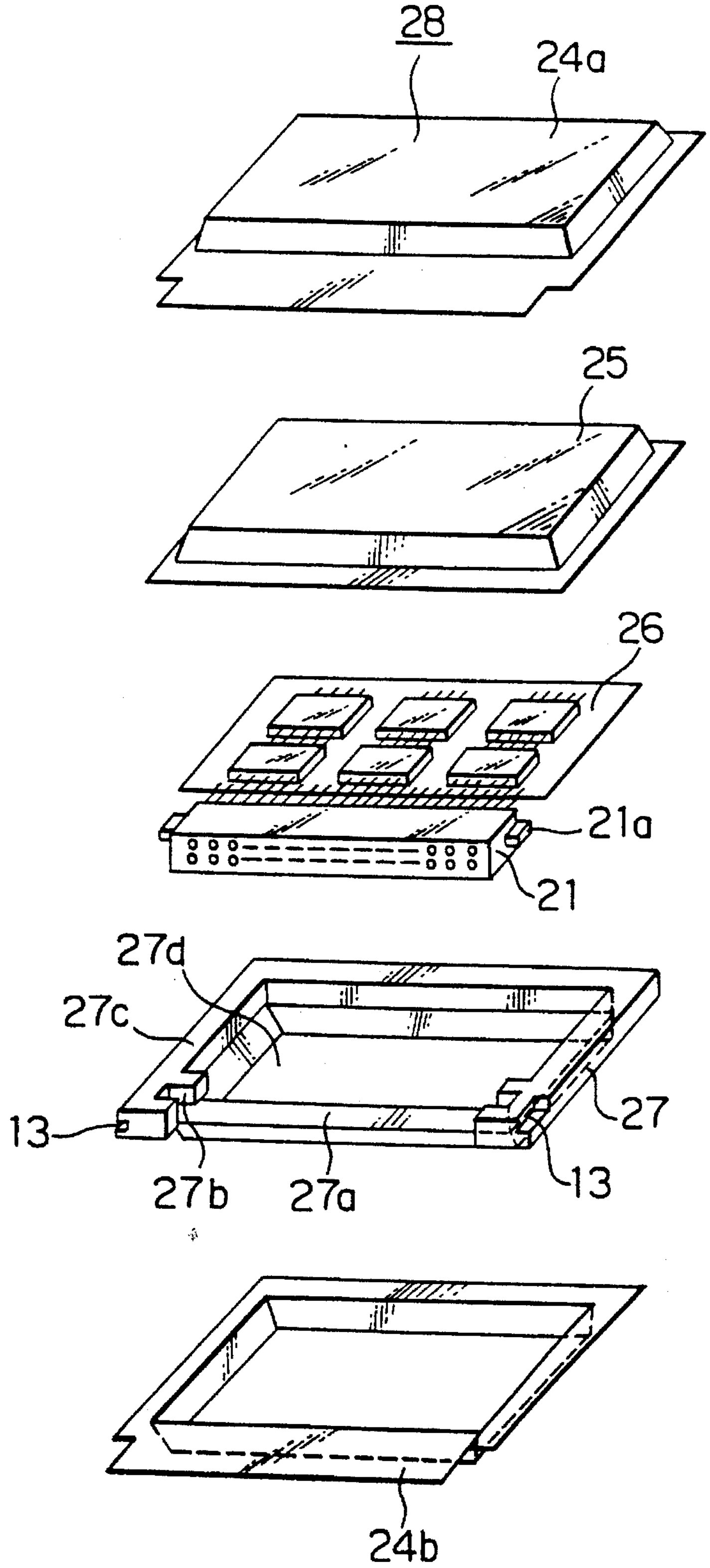
FIG. 5 is an exploded perspective view showing a second embodiment of an IC memory card according to the present invention.
Figure 6:
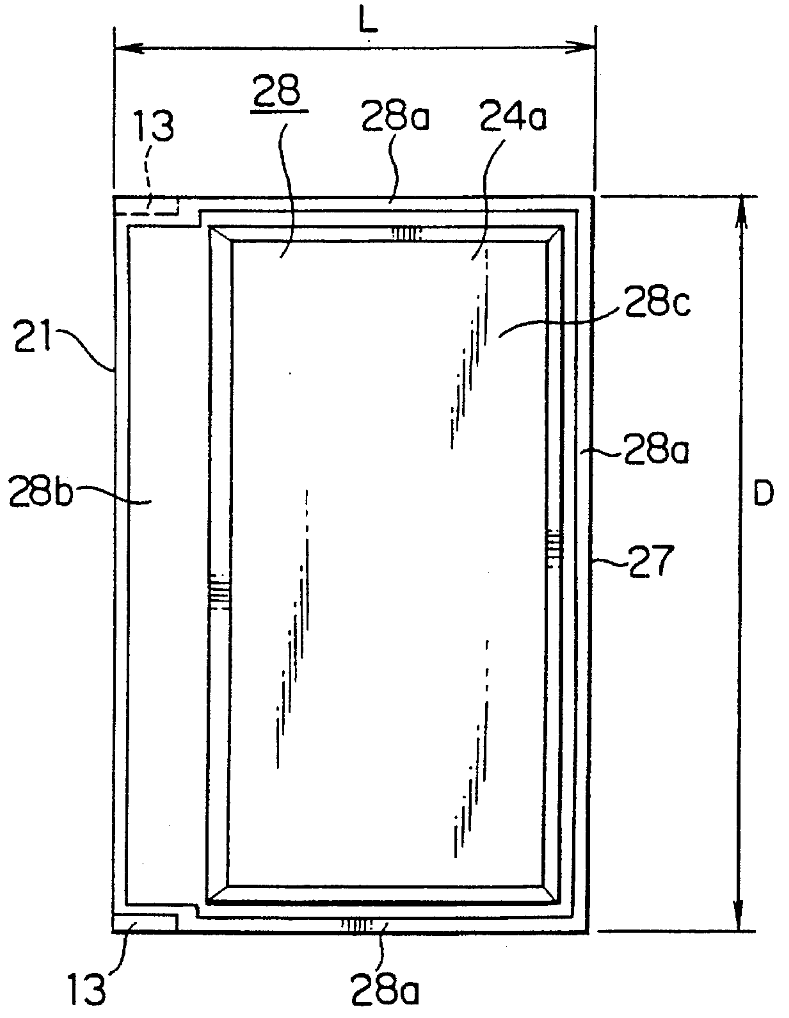
FIG. 6 is a top view of the IC memory card shown in FIG. 5.
Figure 7:
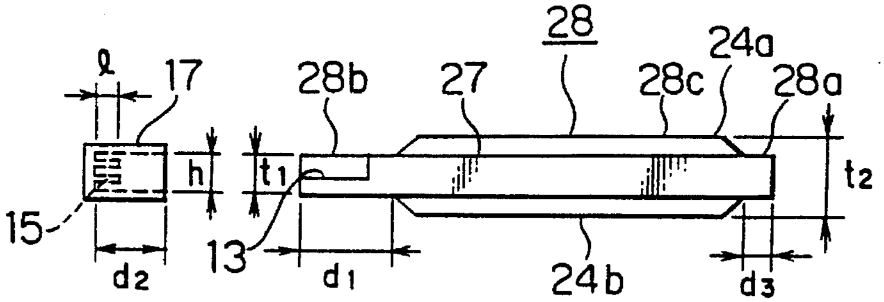
FIG. 7 is a side view showing a second embodiment of the IC memory card and the host device connector.

FIG. 5 is a schematic exploded perspective view showing a second embodiment of the IC memory card 28 according to the present invention, FIG. 6 is a top view of the IC memory card 28 of FIG. 5, and FIG. 7 is a side view of the connecting system between the IC memory card 28 and the host device connector. Since the structure of the host device connector in this embodiment is same as that in the first embodiment, description thereof will be omitted. As shown in FIG. 5, an IC memory card 28 in this embodiment has a circuit board 26 having mounted elements such as semiconductor storage elements or the like and packaged in a rectangular and dish-like main frame 27 made, for example, of resin, and a connector 21 electrically connected to the mounted elements on the circuit board 26 and mounted on a connector mounting portion 27*a* occupying one of the longer sides of the main frame 27. Recess couplers 27*b* are provided at both ends of the connector mounting portion 27*a* so as to be fitted to the projections 21*a* provided at both ends of the connector 21 when the connector 21 is mounted. The main frame 27 is composed of a frame portion 27*c* having a substantially rectangular shape and including the connector mounting portion 27*a* and a bottom face portion 27*d* having a substantially trapezoidal shape and disposed under the frame portion 27*c*. The main frame 27 has a rectangular, dish-like shape whose central portion is downwardly concave. A spacer 25 made, for example, of a resin is disposed on the circuit board 26 for protecting the circuit board 26. The spacer 25 is formed, for example, by molding, and is substantially symmetrical in shape with a bottom face portion 27*d* of the main frame 27 i.e. rectangular, dish-like shape whose central portion is convexed.

A metal panel 24*a* formed by drawing or pressing is applied so as to fit the convex central portion of the spacer 25 and attached closely to the overall upper surface of the spacer 25, an upper surface of the frame portion 27*c* except the connector mounting portion 27*a* of the main frame 27 and the connector 21 so as to cover the spacer 25. A metal panel 24*b* having substantially the same shape as the metal panel 24*a* is attached closely to the overall lower surface of the bottom face portion 27*d* of the main frame 27 and the lower face of the frame portion 27*c*. As described above, the spacer 25 and the bottom face portion 27*d* of the main frame 27 which are reinforcing materials for reinforcing a casing formed by two metal panels 24*a* and 24*b* are attached closely to the overall inner surfaces of two metal panels 24*a* and 24*b*. The connector portion 28*b* (FIG. 6) is composed of the connector mounting portion 27*a* of the main frame 27 and the connector 21 mounted on the connector mounting portion 27*a*. In this embodiment, the upside-down preventing grooves 13 similar to those in the first embodiment for preventing upside-down insertion of the IC memory card 28 may also be provided at both ends of the longitudinal direction of the connector portion 28*b*.

In this embodiment, the width (shorter side) L and the length (longer side) D of the overall IC memory card 28 containing the connector portion 28*b* are also of substantially standard dimensions. As shown in FIG. 6, the number of terminals of a connector 21 can be remarkably increased in the same manner as in the first embodiment by providing connector portion 28*b* having the connector 21 on one entire longer side. Anti-twisting strength and anti-bending strength of the IC memory card 28 can be improved due to drawing of the metal plates 24*a* and 24*b*, which are the outer case body of the IC memory card 28. And, since the spacer 25 and the bottom face portion 27*d* are attached closely to the overall inner surfaces of the metal panels 24*a* and 24*b*, bonding strength to the panels 24*a* and 24*b* can be remarkably increased as compared with the prior art shown in FIG. 15 in which only end portions of the metal panels are attached to the frame-like main frame. Further, the compressive strength of the IC memory card 28 can be improved as compared with the conventional structure with only metal panels.

In this embodiment, a wrong insertion preventing means may be easily formed at a low cost by drawing the central portions of metal panels 24*a* and 24*b* forming a casing. As shown FIG. 7, thickness t1 of the outer peripheral portion 28*a* and the connector portion 28*b* of the IC memory card 28 is thinner than the thickness t2 of the central portion 28*c* as a result of the drawing treatment, and the height h of the host device connector is formed to satisfy the condition of $t1<h<t2$, similar to the first embodiment. Further, when the depth of the host device connector is d2 and a length of the contact pins 15 in the host device connector is 1, the depth d3 of the outer periphery portion 28*a* is constructed so as to satisfy the condition of $d3<d2-1<d1$. Accordingly, even when the IC memory card 28 is erroneously inserted into the host device connector from any side except the connector 28*b*, further insertion is prevented by cooperation of the connector guide 17 with the central portion 28*c* of the IC memory card 28 in contacting each other. Accordingly, mechanical damage of the contact pins 15 in the host device connector can be prevented since the IC memory card 28 never touchs nor bends the contact pins 15.

Third Embodiment

Figure 8:
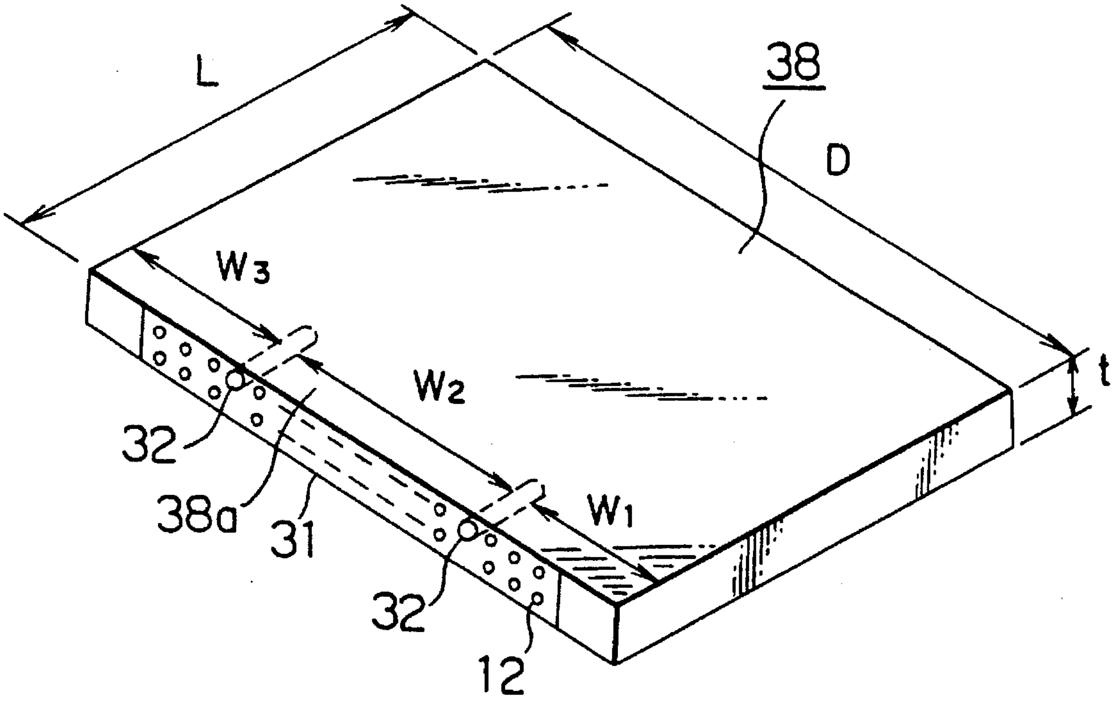
FIG. 8 is a perspective view showing a third embodiment of an IC memory card according to the present invention.

FIG. 8 is a perspective view showing a third embodiment of the IC memory card according to the present invention. In FIG. 8, the IC memory card 38 has a pair of opposite longer sides and it has substantially standard dimensions. One of the longer sides is occupied by a connector portion 38*a* which has a connector 31 similarly to the first and second embodiments. A double row of socket contacts 12 is arranged in a longitudinal direction with the contact pitch of 1 mm in a same manner as in the first embodiment. In this embodiment, two wrong insertion preventing holes 32 which are wrong insertion preventing means are provided in the connector portion 38*a* excluding the end portions in the longitudinal direction thereof as shown in FIG. 8. The wrong insertion preventing holes 32 extend in a direction perpendicular to the end face of the connector 31 as shown by the broken lines in FIG. 8. In order to prevent upside-down insertion of the IC memory card 38, the wrong insertion preventing holes 32 are provided not at the center of the high dimension of the connector 31 but at a slightly upper or lower position. Each of the widths w1, w2, and w3 divided by two wrong insertion preventing holes 32 is shorter than the shorter sides of the IC memory card 38, and the inner diameter and the depth of the wrong insertion preventing holes 32 are larger than the outer diameter of the socket contacts 12. The IC memory card 38 in this embodiment may contain a package case formed of a metal panel and a resin frame, and may be molded integrally by means of resin or the like in the same manner as in the first embodiment. Further, with an application of the structure shown in the second embodiment, an improvement in the strength can be achieved by attaching a spacer formed of a resin or the like having substantially the same shape of the metal panel and a main frame having a bottom face portion close to the inside of the metal panel. In this embodiment, however, it is not necessary to draw the metal panel for preventing wrong insertion because the wrong insertion preventing means are provided.

Figure 9:
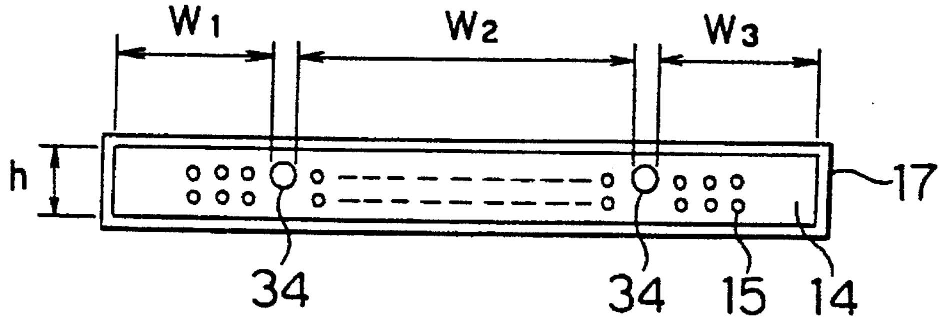
FIG. 9 is a front view showing a third embodiment of a host device connector.

FIG. 9 is a front view showing a host device connector in which the connector 31 of the IC memory card 38 shown in FIG. 8 is received. In FIG. 9, since reference numerals 14, 15 and 17 are same as those in the first embodiment, the explanation thereof will be omitted. Two wrong insertion preventing pins 34 project from the connector face 14 perpendicular to the connector face so as to be inserted into two wrong insertion preventing holes 32 of the IC memory card 38 only when the IC memory card 38 of FIG. 8 is correctly inserted. In other words, two wrong insertion preventing pins 34 are positioned at a slightly upper or lower position in the height dimension of the connector face 14, and three widths divided by two wrong insertion preventing pins 34 are substantially the same as those of w1, w2, and w3 in the IC memory card 38. The diameter of the wrong insertion preventing pins 34 is larger than inner diameters of the socket contacts 12, and the lengths thereof are longer than those of the contact pins 15. The width of the connector guide 17 is set on the basis of position and the length of the wrong insertion preventing pins 34. This will be described in detail later. The contact pins 15 may be, for example, formed by molding with suitable resins upon production of the connector face 14, and may be formed using metallic materials having a suitable strength and then pressed into the connector face 14.

Figure 10:
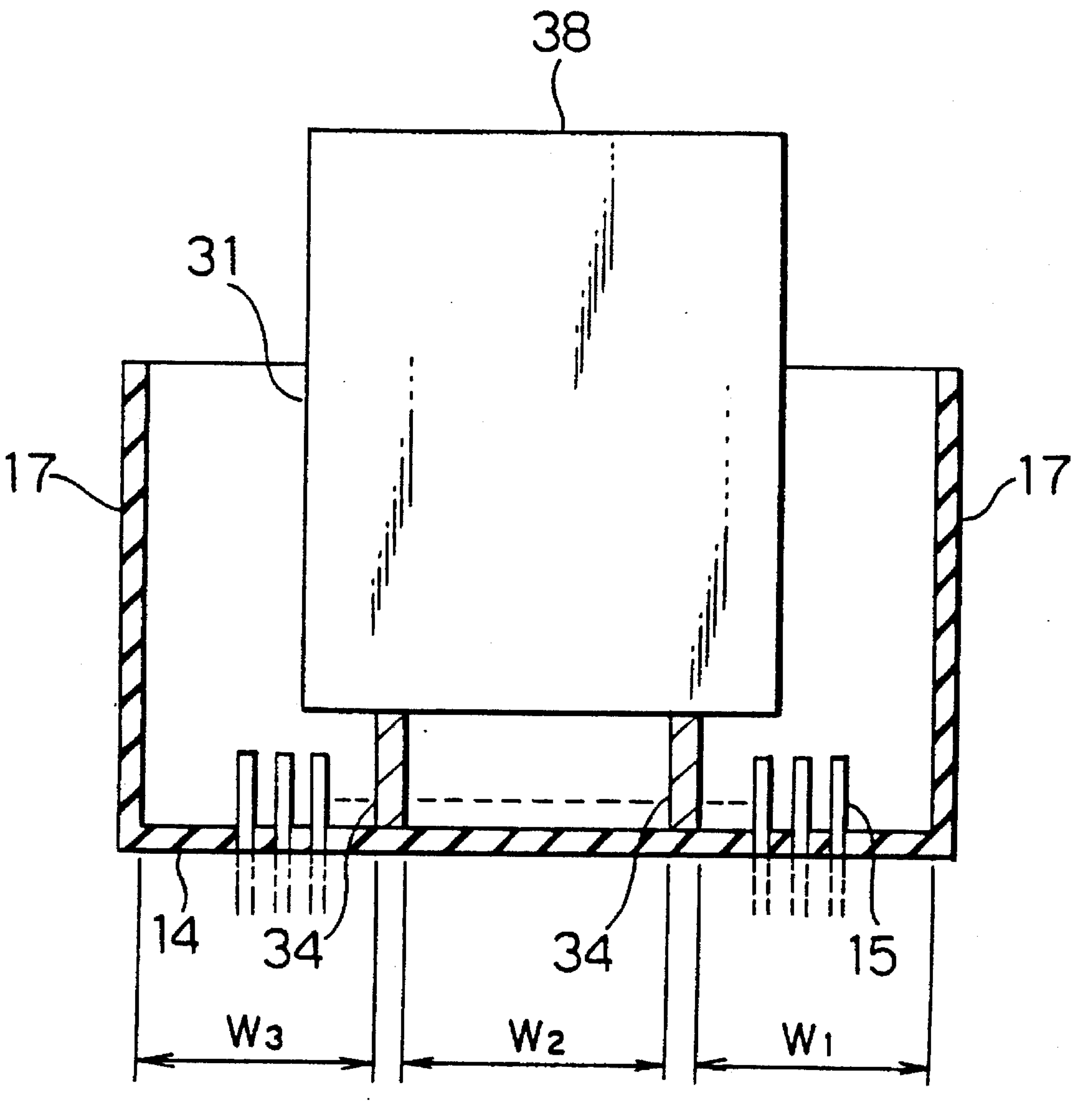
FIG. 10 is a sectional view showing a condition in which an IC memory card is inserted into the host device connector in a wrong orientation rotated 90° from the correct direction.
Figure 11:
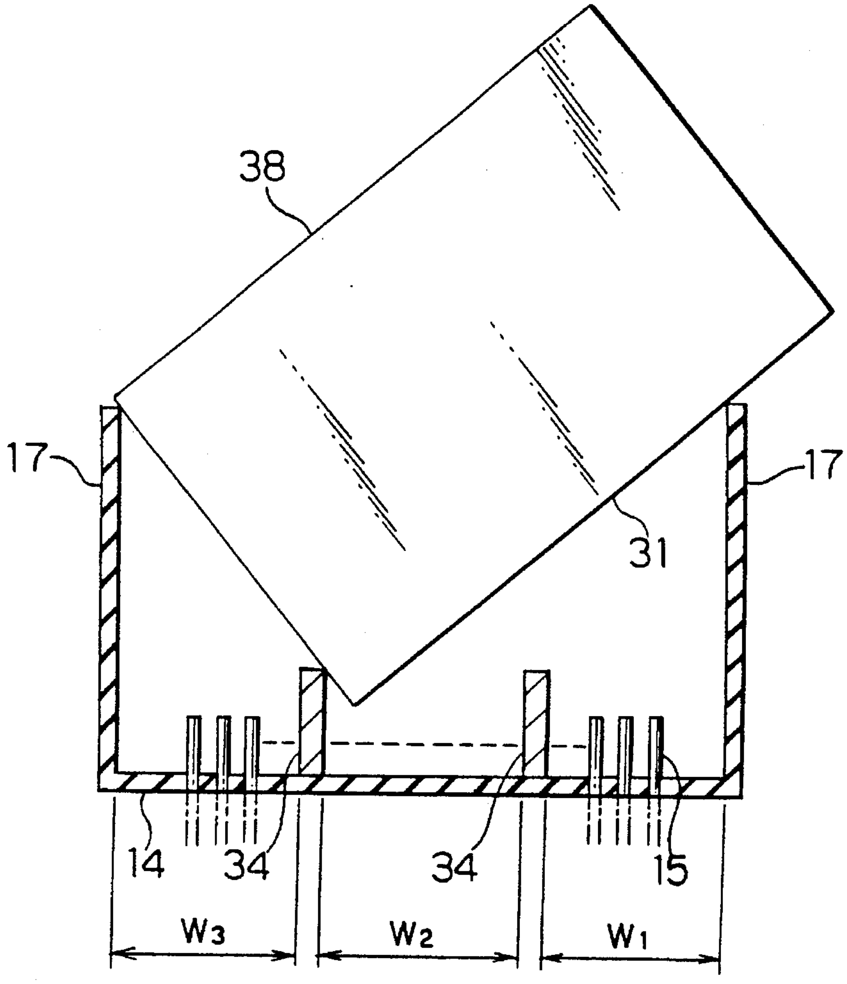
FIG. 11 is a sectional view showing a condition in which an IC memory card is erroneously inserted into the host device connector from an oblique direction.

The wrong insertion preventing means of the IC memory card in the connecting system between IC memory card 38 and a host device connector constructed as described above according to the present invention will be described hereinafter. When the conventional IC memory card 8 (FIG. 15) is inserted from its shorter side or when the IC memory card 38 of this embodiment is inserted in a wrong orientation rotated 90° from correct direction into the host device connector, IC memory card 8 or 38 is obstructed by the wrong insertion preventing pins 34 and further insertion can be rejected because each of the widths w1, w2 and w3 divided by two wrong insertion preventing pins 34 is shorter than the shorter sides of the IC memory card 8 or 38, and the lengths of the wrong insertion preventing pins 34 are longer than those of the contact pins 15, as shown in FIG. 10. Accordingly, mechanical damage of the contact pins 15 can be prevented since the IC memory card 8 or 38 never touchs nor bends the contact pins 15. And, the diameter of the wrong insertion preventing pins 34 of the host device connector is larger than the inner diameter of the socket contacts 12 of the IC memory card 38. Accordingly, the wrong insertion preventing pins 34 are not inserted into the socket contacts 12. Further, since the wrong insertion preventing pins 34 are positioned not at the center position but at slightly upper and lower position in the height dimension h of the connector face 14, the upside-down insertion of the IC memory card 38 can be also prevented. Still further, even when the IC memory card 38 is erroneously inserted from an oblique direction as shown in FIG. 11, controlling the length and positions of the wrong insertion preventing pins 34 and the width of the connector guides 17 prevents the wrong insertion preventing pins 34, the connector guides 17 and the IC memory card 34 from cooperating with each other, thereby preventing contact of the IC memory card 38 with the contact pins 15.

In this embodiment, the number of terminals in the connector 31 can be also increased, similar to the first and the second embodiments because the connector portion 38*a* is disposed along one of longer sides of the IC memory card 38 the connector portion 38*a*. And, as described above, the wrong insertion preventing means can be easily obtained with a simple structure and mechanical damage of the contact pins 15 or the like due to the wrong insertion of the IC memory card 38 can be certainly prevented. Further, in this embodiment, the upside-down insertion of the IC memory card 38 can be prevented because the wrong insertion preventing holes 32 of the IC memory card 38 and the wrong insertion preventing pins 34 of the host device connector are positioned not at the center position of the height dimension. Accordingly, in this embodiment, the upside-down preventing grooves 3 and 13 and the upside-down preventing keys 6 and 16 provided on both ends of the connector portion used in the embodiment of FIG. 1 and the prior art of FIG. 15 need not be provided.

In order to prevent the insertion of the IC memory card 38 into the conventional host device connector in a wrong orientation rotated 90° from correct direction, the thickness t of the IC memory card 38 may be set to satisfy $H<t$, where H is an inner height of the conventional host device connector.

Fourth Embodiment

Figure 12:
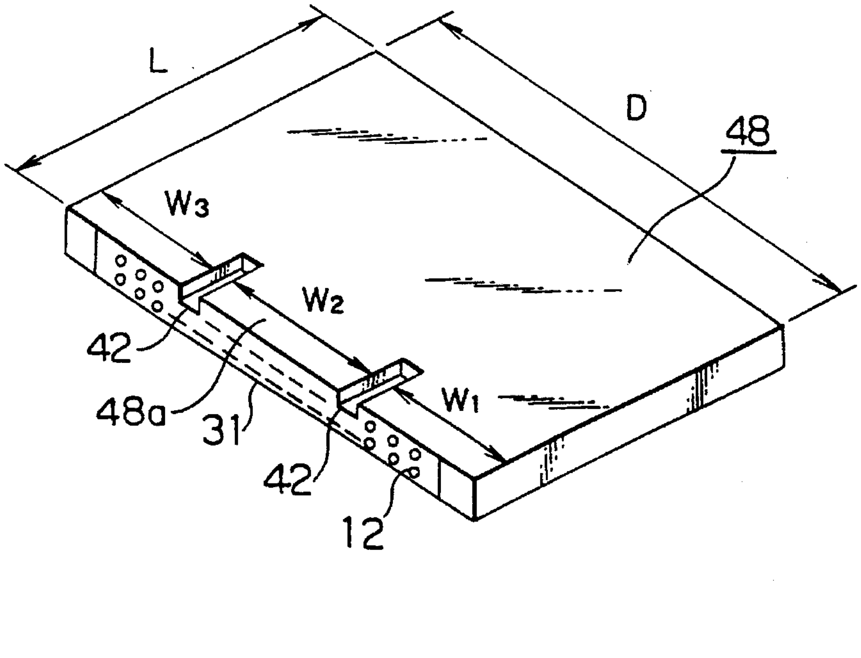
FIG. 12 is a perspective view showing a fourth embodiment of an IC memory card according to the present invention.

FIG. 12 is a perspective view showing a fourth embodiment of an IC memory card. The structure of the IC memory card 48 of this embodiment is basically the same as that of the third embodiment except for the structure of the wrong insertion preventing means. Accordingly, the same structures will be shown by the same reference numerals and explanation thereof will be omitted. The wrong insertion preventing means in this embodiment is composed of two wrong insertion preventing grooves 42 provided on an upper portion of the connector 48*a* having the connector 31. Two wrong insertion preventing grooves 42 are provided at portions of the connector portion 48*a* excluding both ends thereof, and each of the widths w1, w2 and w3 divided by two wrong insertion preventing grooves 42 is shorter than the shorter sides of the IC memory card 48. And, the width and depth of the wrong insertion preventing grooves 42 are larger and deeper than the inner diameter and depth of the socket contacts 12.

Figure 13:
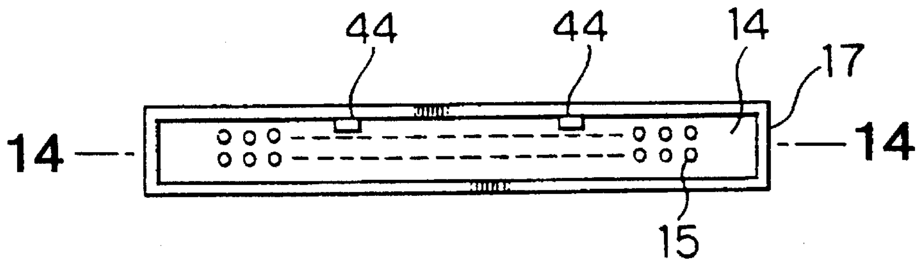
FIG. 13 is a front view showing a fourth embodiment of a host device connector.
Figure 14:
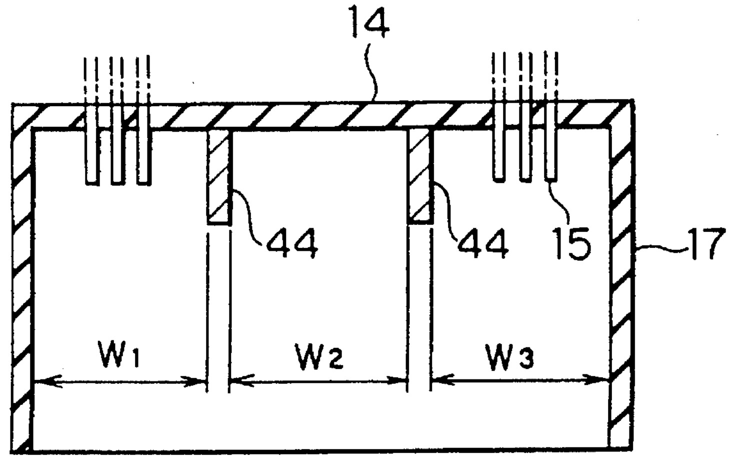
FIG. 14 is a sectional view of the host device connector of the fourth embodiment taken along the line 14—14 in FIG. 13.

FIG. 13 is a front view showing a host device connector for receiving the connector 31 of the IC memory card 48 shown in FIG. 12, and FIG. 14 is a sectional view of FIG. 13 taken along the lines 14—14. The structure of the host device connector in this embodiment is same as that in the third embodiment except for the structure of the wrong insertion preventing means. Accordingly, only the structure of the wrong insertion preventing means will be explained. The wrong insertion preventing means in this embodiment includes the wrong insertion preventing keys 44 provided along the inner wall of upper portion of the connector guide 17 of the host device connector as shown in the drawing. The wrong insertion preventing keys 44 correspond to the wrong insertion preventing grooves 42 of the IC memory card 48 of FIG. 12 so as to be engaged therewith only when the IC memory card 48 is securely inserted into the host device connector. Accordingly, the widths divided by two wrong insertion preventing keys 44 are substantially same as w1, w2 and w3 of the IC memory card in FIG. 12. And, the width of the wrong insertion preventing keys 44 is larger than the inner diameter of the socket contacts 12, and the lengths thereof are longer than the contact pins 15.

In the connecting system in this embodiment, the width (shorter side) L and the length (longer side) D of the entire IC memory card 38 are of substantially standard dimensions, and one of the longer sides of the IC memory card 38 is occupied by the connector 31. Accordingly, the number of terminals in the connector 31 can be increased and the same effect as in the third embodiment can be obtained with respect to the wrong insertion preventing means.

In one form of the invention, there is provided an IC memory card which has a pair of opposite longer sides, wherein one of the longer sides is occupied by a connector portion having a connector to be electrically connected to a host device connector. This feature of the invention offers the following advantage. The number of electrode terminals of the connector can be remarkably increased with a use of the electrode terminal having the same inner diameter as that of the conventional electrode terminals while maintaining the same contact pitch as the conventional pitch.

In another form of the invention, there is provided an IC memory card comprising a wrong insertion preventing-means for preventing wrong insertion of the IC memory card into the host device connector from a direction other than the connector portion by cooperating with the host device connector. A host device connector for receiving the connector portion of the IC memory card comprising a wrong insertion preventing means for preventing further insertion of the IC memory card by cooperating with the IC memory card when the IC card is erroneously inserted is provided according to the present invention. Also, a connecting system comprising complementary wrong insertion rejection means on the IC memory card and the host device connector, respectively, abut against each other when the IC memory card is erroneously inserted from a direction other than the connector portion and to engage with each other only when the IC memory card is correctly inserted, thereby preventing wrong insertion of the IC memory card from a direction other than the connector portion. This feature of the invention offers the following advantages. The complementary wrong insertion preventing mechanisms can be easily provided on the IC memory card and the host device connector, respectively. Various wrong insertions of the IC memory card such that the IC memory card is inserted in a wrong orientation into the host device connector and that another IC memory card which is incompatible with the host device connector is inserted into the host device connector can be prevented. Mechanical damage of the contact pins in the host device connector due to the wrong insertion of the IC memory card can be prevented.

In a still another form of the invention, there is provided an IC memory card wherein the wrong insertion preventing means includes the connector portion of the IC memory card and other area of the IC memory card excluding at least the connector portion, wherein the connector portion satisfies the condition of $t1<h<t2$, where t1 is a thickness of the connector portion of the IC memory card, t2 is a thickness of the other area of the IC memory card, and h is a height of the host device connector; a host device connector wherein the wrong insertion preventing mechanism of the host device connector comprises the host device connector, wherein the host device connector satisfies the condition of $t1<h<t2$, where t1 is a thickness of the connector portion of the IC memory card, t2 is a thickness of the other area of the IC memory card excluding at least the connector portion, and h is a height of the host device connector; and a connecting system wherein the wrong insertion preventing mechanisms include the connector portion of the IC memory card, and another area of the IC memory card excluding at least the connector portion and the host device connector, wherein the connector portion satisfies the condition of $t1<h<t2$, where t1 is a thickness of the connector portion of the IC memory card, t2 is a thickness of the other area of the IC memory card, and h is a height of the host device connector. This feature of the invention offers the following advantages. Only the connector area of the IC memory card can be inserted into the host device connector. The insertion of the IC memory card in a wrong orientation rotated 90° from the correct position or from the side where no connector is provided can be prevented.

In a further form of the invention, there is provided an IC memory card wherein the wrong insertion preventing means includes an area of the IC memory card having a thickness of t and satisfying the condition of $H<t$, where H is a height of the host device connector of standard size, the area being provided on at least each of shorter sides of the IC memory card; and a connecting system wherein the wrong insertion preventing means includes an area of the IC memory card having a thickness of t and satisfying the condition of $H<t$, where H is a height of the host device connector of standard size, the area being provided on at least each of shorter sides of the IC memory card. This feature of the invention offers the following advantages. The wrong insertion of the IC memory card of the present invention into the conventional host device connector can be prevented. Mechanical damage of the contact pins in the conventional host device connector due to the wrong insertion of the IC memory card can be also prevented.

In a still further form of the invention, there is provided an IC memory card wherein the wrong insertion preventing means has complementary wrong insertion preventing means on the host device engaging the connector only when the IC memory card is correctly inserted into the host device connector, and wherein the wrong insertion preventing means are provided on portions of longitudinal direction of the connector portion of the IC memory card excluding both ends thereof; a host device connector wherein the wrong insertion preventing means of the host device connector is complementary with the wrong insertion preventing means of the IC memory card only when the IC memory card is correctly inserted and engaged into host device connector, wherein the wrong insertion preventing means of the host device connector abuts against an IC memory card erroneously inserted from a direction other than the connector portion to prevent further insertion, and wherein the wrong insertion preventing means are provided in a longitudinal direction of the host device connector excluding both ends thereof; and connecting system wherein the wrong insertion preventing means is provided in a longitudinal direction of the connector portion of the IC memory card and the host device connector excluding the ends thereof. This feature of the invention offers the following advantages. Even when the IC memory card having shorter sides which are shorter than the overall length of the host device connector is erroneously inserted, the wrong insertion preventing means prevents the erroneously inserted IC memory card from being inserted into the inner portion of the host device connector.

In another form of the invention, there is provided a host device connector wherein the wrong insertion preventing means of the host device connector comprises the host device connector satisfying the condition of $h<T$, where h is a height of the host device connector and T is a thickness of the IC memory card with standard dimensions; and a connecting system wherein the wrong insertion preventing means includes the IC memory card and the host device connector wherein the IC memory card satisfies the condition of $t<h<T$, where t is a thickness of the connector portion of the IC memory card, h is a height of the host device connector and T is a thickness of the IC memory card with standard dimensions. This feature of the invention offers the following advantage. The wrong insertion of the conventional IC memory card having the standard dimensions into the host device connector of the present invention can be prevented.

In a further form of the invention, there is provided an IC memory card comprising a casing and reinforcing materials on an inner face of the casing for reinforcing the casing. This feature of the invention offers the following advantage. Compression strength and bonding strength of the first casing can be improved.

In a still further form of the invention, there is provided a host device connector wherein the wrong insertion preventing means of the host device connector divides the width dimension of the host device connector into sections shorter than the shorter sides of the IC memory card, and wherein the wrong insertion preventing means is provided at a level of offset from the center of height dimension of the host device connector; and a connecting system wherein the wrong insertion preventing means is provided in such a way that width dimension of the host device connector is divided into sections shorter than the shorter sides of the IC memory card, and that the height dimension of the host device connector is not divided into vertically symmetrical sections. This feature of the invention offers the following advantages. An insertion of the IC memory card in a wrong orientation rotated 90° from correct direction can be prevented. Upside-down insertion of the IC memory card can be also prevented.

What is claimed is:

1. An IC memory card having a width and a length for connection to a host device connector, said IC memory card comprising a body having a pair of longer sides and a pair of shorter sides and a connector portion disposed at one of said longer sides of said body, said connector portion including a card connector for electrically connecting said IC memory card to a host device connector, said connector portion having a thickness t1, said body having a thickness t2, and the host device connector having an inner height h, wherein $t1<h<t2$ whereby said body cannot be inserted into the host device connector but said connector portion of said IC memory card can be inserted into and received by the host device connector to connect said IC memory card and the host device connector electrically.

2. The IC memory card as claimed in claim 1 comprising wrong insertion preventing means for preventing said IC memory card from being inserted into the host device connector in an incorrect orientation by cooperating with the host device connector.

3. The IC memory card as claimed in claim 2 wherein said wrong insertion preventing means comprises a portion of said IC memory card disposed on at least each of said shorter sides of said IC memory card and having a thickness t, wherein $$h<t,$$

and h is the inner height of the host device connector.

4. The IC memory card as claimed in claim 2 wherein said wrong insertion preventing means has a complementary shape for engaging wrong insertion preventing means disposed on the host device connector only when said IC memory card is correctly inserted into the host device connector wherein said wrong insertion preventing means is provided on a portion of said connector portion.

5. The IC memory card as claimed in claim 1 comprising a casing and reinforcing means disposed on an inner surface of said casing for reinforcing said casing.

6. A connecting system comprising:

an IC memory card having a body including a pair of longer sides and a pair of shorter sides, a connector portion disposed at one of said longer sides, said connector portion including a card connector for electrically connecting said IC memory card to a host device connector, said card connector portion having a thickness t1 and said body having a thickness t2; and a host device connector for receiving said connector portion of said IC memory card, said host device connector having an inner height h, wherein $t1<h<t2$ whereby said body cannot be inserted into the host device connector but said connector portion of said IC memory card can be inserted into and received by the host device connector to connect said IC memory card and the host device connector electrically.

7. The connecting system as claimed in claim 6 comprising complementary wrong insertion preventing means disposed on said IC memory card and said host device connector, respectively, for abutting each other when said IC memory card is inserted in said host device connector in an incorrect orientation and for engaging each other only when said IC memory card is inserted in said host device connector with the correct orientation, whereby said IC memory card is prevented from being inserted into said host device connector in an incorrect orientation.

8. The connecting system as claimed in claim 7 wherein said wrong insertion preventing means is provided on said connector portion of said IC memory card excluding ends of said connector portion and on a portion of said host device connector excluding ends of said host device connector.

9. The connecting system as claimed in claim 8 wherein said wrong insertion preventing means divides a width dimension of said host device connector into sections shorter than said shorter sides of said IC memory card and divides a height dimension of said host device connector into asymmetrical sections.

* * * * *